US008138535B2

(12) United States Patent
Innocent

(10) Patent No.: US 8,138,535 B2
(45) Date of Patent: Mar. 20, 2012

(54) METHOD FOR MANUFACTURING A PIXEL SENSING CIRCUIT

(75) Inventor: Manuel Innocent, Wezemaal (BE)

(73) Assignee: On Semiconductor Trading Ltd., Hamilton (BM)

( * ) Notice: Subject to any disclaimer, the term of this patent is extended or adjusted under 35 U.S.C. 154(b) by 0 days.

(21) Appl. No.: 13/117,581

(22) Filed: May 27, 2011

(65) Prior Publication Data
US 2011/0227134 A1 Sep. 22, 2011

Related U.S. Application Data

(63) Continuation of application No. 12/413,557, filed on Mar. 28, 2009, now Pat. No. 7,977,717.

(60) Provisional application No. 61/155,473, filed on Feb. 25, 2009.

(51) Int. Cl.
*H01L 31/062* (2006.01)

(52) U.S. Cl. ................. 257/292; 257/401; 257/E27.132

(58) Field of Classification Search .................. 257/292, 257/401, E27.132, E27.133
See application file for complete search history.

(56) References Cited

U.S. PATENT DOCUMENTS

| | | | |
|---|---|---|---|
| 5,625,210 A | 4/1997 | Lee et al. | |
| 6,690,074 B1 | 2/2004 | Dierickx et al. | |
| 7,304,338 B2 | 12/2007 | Hiroshi | |
| 7,977,717 B1 * | 7/2011 | Innocent | 257/292 |
| 2005/0099517 A1 | 5/2005 | Kuwazawa | |
| 2006/0289911 A1 * | 12/2006 | Lee et al. | 257/292 |
| 2008/0258187 A1 | 10/2008 | Ladd et al. | |

OTHER PUBLICATIONS

U.S. Appl. No. 61/155,473: Innocent, Manuel "Low Leakage Pinned Photo Diode Using Ring Transfer Gate"; filed Feb. 25, 2009; 51 pages.
Hughes et al. "Radiation effects and hardening of MOS technology: devises and circuits," IEEE Transactions on Nuclear Science; Jun. 2003; <http://ieeexplore.ieee.org/stamp>; 22pages.
Mavis et al. "Employing radiation hardness by design techniques with commercial integrated circuit process"; in Proc. Digital Avionics System Conference (16th DASC, AIAA/IEEE); 1997; 8 pages.
Bogaerts et al. "Total Dose and displacement damage effects in a radiaton-hardened CMOS APS"; IEEE Transactions on Electron Devices; Jan. 2003; <http://ieeexplore.ieee.org/stamp>; 7 pages.

* cited by examiner

*Primary Examiner* — Mark Prenty
(74) *Attorney, Agent, or Firm* — Rennie William Dover

(57) ABSTRACT

Systems and methods of pixel sensing circuits. In accordance with a first embodiment of the present invention, a pixel sensing circuit includes a floating diffusion functionally coupled to and surrounded by a ring transfer transistor. The ring transfer transistor is functionally coupled to and surrounded by a photo diode. The photo diode may be surrounded by a region of poly silicon. The disclosed structure provides radiation hardening and low light performance.

11 Claims, 6 Drawing Sheets

US 8,138,535 B2

METHOD FOR MANUFACTURING A PIXEL SENSING CIRCUIT

RELATED CASE

The present application is a continuation application of prior U.S. patent application Ser. No. 12/413,557, filed on Mar. 28, 2009, now U.S. Pat. No. 7,977,717, which issued on Jul. 12, 2011, which claims benefit to U.S. Provisional Patent Application No. 61/155,473, filed Feb. 25, 2009, which are hereby incorporated by reference, and priority thereto for common subject matter is hereby claimed.

TECHNICAL FIELD

Embodiments of the present invention relate to the field of electronic image sensors.

BACKGROUND

Complementary Metal Oxide Semiconductor (CMOS) image sensors generally offer advantages in the areas of integration, power consumption/dissipation and total system size in comparison to charge coupled device (CCD) image sensors. CMOS image sensors have come to dominate the image sensor marketplace for numerous applications, including, for example, camera phones, security cameras, PC video capture, bar-code scanners, fax machines, desk top scanners, toys, biometric devices and the like.

An image sensor, including CMOS image sensors, has "dark current." Dark current is generally a signal level from an image sensor when the image sensor is not exposed to light, e.g., is in darkness. Dark current is analogous to a noise floor for an image sensor. In general, the lower the dark current, the better an image sensor performs, especially in low light conditions.

Some applications for image sensors, e.g., for military and/or satellite use, specify increased radiation hardness. For example, protons and gamma rays in the space environment can rapidly degrade an image sensor.

BRIEF DESCRIPTION OF THE DRAWINGS

Unless otherwise noted, the drawings are not drawn to scale.

DETAILED DESCRIPTION

Figure 1:
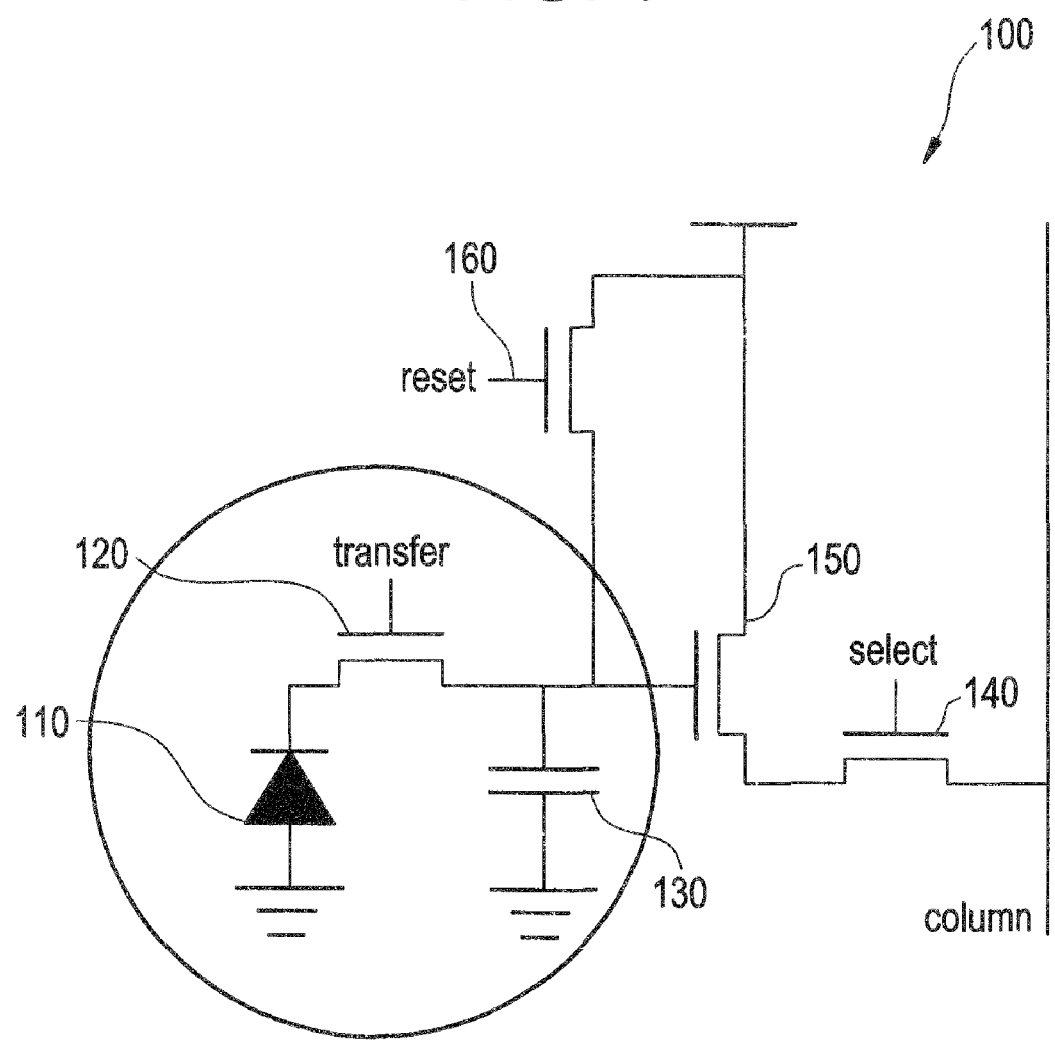
FIG. 1 illustrates a schematic of an embodiment of a pixel sensing circuit, in accordance with embodiments of the present invention.

Reference will now be made in detail to various embodiments of the invention, examples of which are illustrated in the accompanying drawings. While the invention will be described in conjunction with these embodiments, it is understood that they are not intended to limit the invention to these embodiments. On the contrary, the invention is intended to cover alternatives, modifications and equivalents. Furthermore, in the following detailed description, numerous specific details are set forth in order to provide a thorough understanding of the disclosure. However, it will be recognized by one of ordinary skill in the art that the disclosed embodiments may be practiced without these specific details. In other instances, well known methods, procedures, components, and circuits have not been described in detail as not to unnecessarily obscure aspects of the invention.

NOTATION AND NOMENCLATURE

As used in the present application, the terms "pixel" or "pixel sensing circuit" are used interchangeably to describe or refer to the smallest unit of light sensitive circuit of an image sensing device or pixel array. For example, a pixel generally includes one light sensitive element, e.g., a photo diode, and associated circuitry for managing that light sensitive element and its output. In the electronic image sensing arts, image sensing devices generally comprise multiple pixels, e.g., organized into an array of pixels, and are generally described in terms of their resolution in pixels. For example, the "LUPA13002" image sensing device, commercially available from Cypress Semiconductor Corporation of San Jose, Calif., may comprise an array of 1280×1024 individual active pixels, for a total of 1,310,720 individual pixels. Individual pixels or pixel sensing circuits are frequently described in terms of the number of transistors per each photo-sensitive element. For example, a "4T" pixel generally comprises four transistors per pixel.

Embodiments of image sensors specify both radiation hardening and very low dark current. For example, star trackers are image sensors utilized on satellites and deep space craft that track stars for navigation and/or orientation purposes. Since these image sensors are in space, a radiation hardened design is optimal. In addition, since they are generally aimed at relatively faint stars, star tracking sensors specify very high levels of low light performance, and hence specify very low dark current.

Embodiments of systems and methods include low leakage pinned photodiodes using ring transfer transistors. In addition, systems and methods of image sensors with photo diodes surrounding transfer transistors are disclosed in embodiments herein. Embodiments described herein may be compatible and complementary with existing systems and methods of semiconductor image sensor manufacturing and operation.

Systems and methods of low leakage pinned photodiodes using ring transfer transistors may be disclosed in embodiments herein. In accordance with a first embodiment of the present invention, a pixel sensing circuit includes a charge storage element functionally coupled to and surrounded by a photo diode. The charge storage element may include a floating diffusion, and the charge storage element may further include a transfer transistor for coupling the floating diffusion to the photo diode.

In accordance with an embodiment of the present invention, a pixel sensing circuit includes a transfer transistor functionally coupled to and surrounded by a photo diode. The transfer transistor may include an enclosed geometry MOSFET.

In accordance with an embodiment of the present invention, a pixel sensing circuit includes a floating diffusion functionally coupled to and surrounded by a ring transfer transistor. The ring transfer transistor is functionally coupled to and surrounded by a photo diode. The photo diode may be surrounded by a region of poly silicon.

FIG. 1 illustrates a schematic of an embodiment of a pixel sensing circuit 100, in accordance with embodiments of the present invention. Pixel 100 is a four transistor, or "4T," pixel. It is appreciated that embodiments in accordance with the present invention are well suited to other pixel architectures, including, for example, "shared" 4T pixels, e.g., a pixel that shares one or more nodes with another pixel, and 5T pixels.

Pixel 100 comprises a photo diode 110, which may be a "pinned" or buried photo diode. The photo diode 110 collects electrons generated by photons interacting with the silicon. Transfer transistor 120 transfers that charge to capacitance 130, when closed. Capacitance 130 may be formed by a floating diffusion. The floating diffusion 130 serves as an analog storage element for charge from photo diode 110 and the capacitance 130 converts the collected charge into a voltage.

Pixel 100 comprises four transistors in an embodiment. Pixel reset transistor 160 functions to bring floating diffusion 130 to a predetermined potential, known as the reset level. Transfer transistor 120 transfers charge from the photo diode 110 to the floating diffusion 130. A combination of closing reset transistor 160 and transfer transistor 120, overlapping or non-overlapping, drains charge out of photo diode 110, e.g., to "reset" photo diode 110. When reset transistor 160 is open and transfer transistor 120 is closed, all charge from the photo diode 110 is transferred to floating diffusion 130, stored on the floating diffusion and converted into a voltage by the capacitance of 130. Source follower transistor 150 is an amplifier that generally serves as a buffer to read the voltage on floating diffusion 130. A select transistor 140 serves to couple the output voltage of the source follower 150 to a column line.

In general, transfer transistor 120 receives clocked control signals to control the flow of charge out of photo diode 110. The charge is generally the result of interaction between light energy and photo diode 110. In typical operation, reset transistor 160 and transfer transistor 120 will close together to drain charge from floating diffusion 130 and the photo diode 110. Transfer transistor 120 will open again. This is the beginning of the integration portion of the cycle. Reset transistor 160 may be either open or closed during integration. Reset transistor 160 then closes again and opens again to reset floating diffusion 130 to the reset level at the beginning of the readout operation. The reset level voltage is read through source follower 150 and select transistor 140 to the column. Then transfer transistor 120 closes to allow charge from photo diode 110 to charge floating diffusion 130. Transfer transistor 120 opens to end the integration portion of the cycle. The charge is stored on the floating diffusion and converted into a voltage by the capacitance of 130. This is the signal level. The signal level voltage is read through source follower 150 and select transistor 140 to the column. Typically, the reset voltage is subtracted from the signal voltage external to the pixel. This subtraction eliminates the noise on the reset level.

Figure 2:
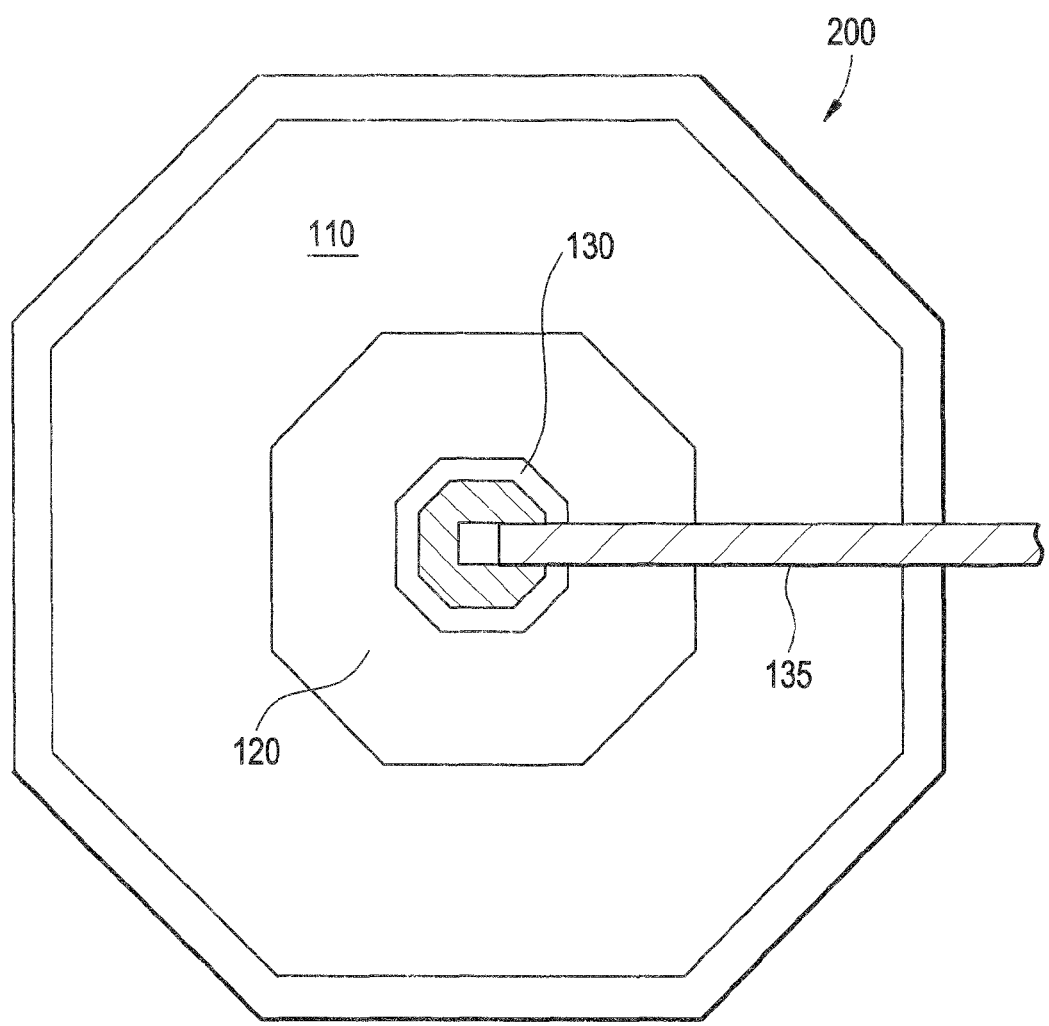
FIG. 2 illustrates a plan or layout view of a photodiode and a ring transfer gate, in accordance with embodiments of the present invention.

FIG. 2 illustrates a plan or layout view of a photodiode and a ring transfer transistor 200, in accordance with embodiments of the present invention. FIG. 2 is not to scale, so as to better illustrate selected features of structure 200. Structure 200 generally corresponds to photo diode 110, transfer transistor 120 and floating diffusion 130 as highlighted in the circled portion of schematic 100 of FIG. 1.

In accordance with embodiments of the present invention, a floating diffusion 130 is surrounded by a transfer transistor 120. Floating diffusion 130 and transfer transistor 120 are in turn surrounded by a photo diode 110. Floating diffusion 130, transfer transistor 120 and photo diode 110 are illustrated as regular octagons. However, embodiments in accordance with the present invention are well suited to other shapes, including, for example, circles, approximations of circles, rectangles and other regular and irregular polygons. It is also not required that floating diffusion 130, transfer transistor 120 and photo diode 110 have the same center, in accordance with embodiments of the present invention.

In accordance with embodiments of the present invention, the performance of structure 200 may benefit from locating floating diffusion 130 and transfer transistor 120 off center, e.g., to the right in the view of FIG. 2, in order to shorten trace 135 from floating diffusion 130 to source follower amplifier 150. For example, the capacitance of trace 135 contributes to the total floating diffusion capacitance 130 setting the conversion gain from charge to voltage, when reading the pixel. Reducing the capacitance of trace 135 may optimize the signal to noise ratio when reading from floating diffusion 130.

Figure 3:
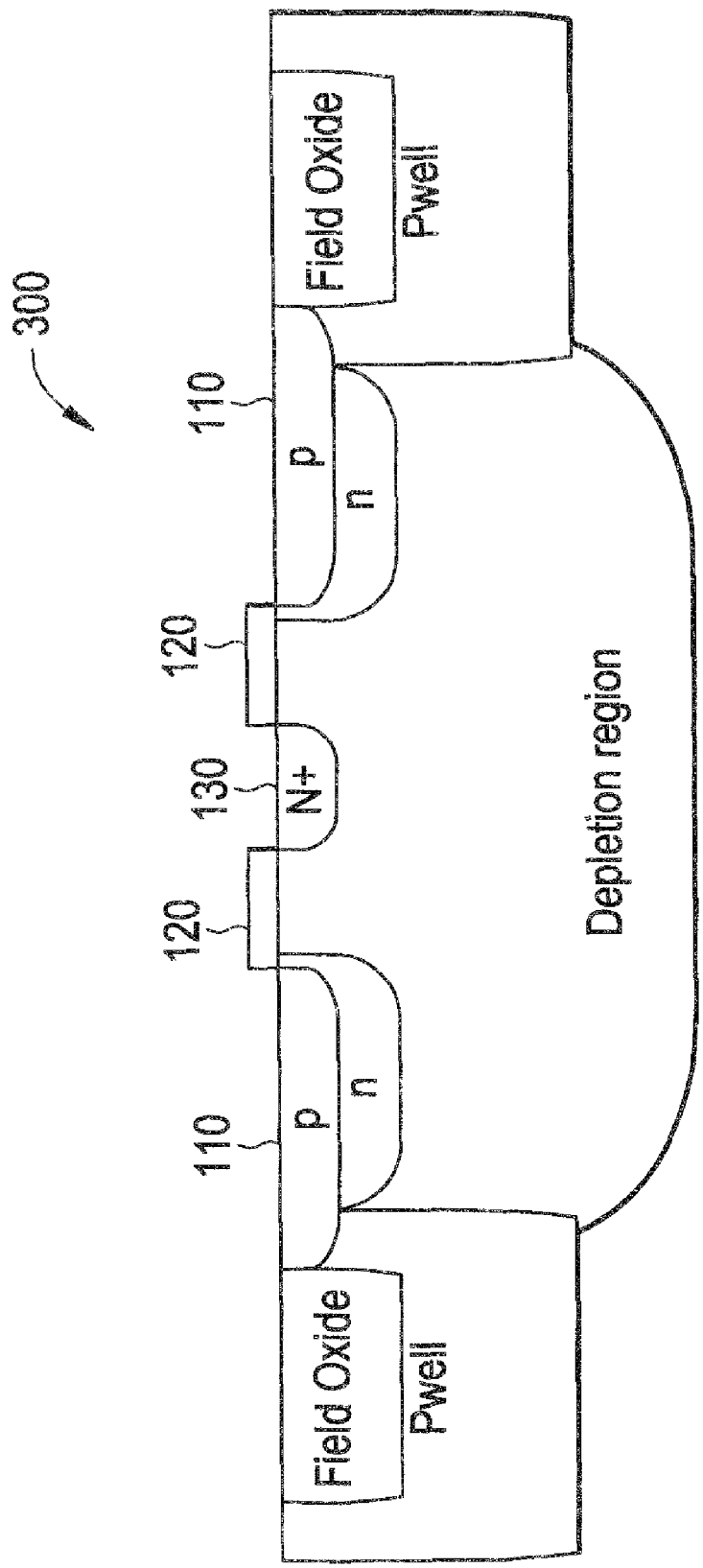
FIG. 3 illustrates a side sectional view of a photodiode and a ring transfer gate, in accordance with embodiments of the present invention.

FIG. 3 illustrates a side sectional view of a photodiode and a ring transfer transistor 300, in accordance with embodiments of the present invention. FIG. 3 is not to scale, so as to better illustrate selected features of structure 300. Structure 300 generally corresponds to photo diode 110, transfer transistor 120 and floating diffusion 130 as illustrated in FIG. 2 and as highlighted in the circled portion of schematic 100 of FIG. 1.

Structure 300 comprises a floating diffusion 130 surrounded by a transfer transistor 120. Transfer transistor 120 is in turn surrounded by photo diode 110. It is appreciated that structure 300 does not have shallow trench isolation (STI) features.

Transfer transistor 120 may be a "ring" or "annular" type of transistor. In general, a ring-type transistor is a type of enclosed geometry MOSFET in which an inner portion, usually configured as a drain of the device, is surrounded by a channel region under a gate, which in turn is surrounded by an outer active portion, e.g., a source. Another type of enclosed geometry MOSFET is known as a "waffle" layout.

Design of, and design with such enclosed geometry MOSFETs, e.g., ring transistors, has been generally discouraged as such devices are generally not accurately modeled by existing design tools, e.g., circuit simulators. Embodiments of enclosed geometry MOSFETs have difficulty in obtaining width to length, or "W/L," ratios of less than about two to one. It is appreciated that the W/L ratio is a standard design parameter used for the design, layout and modeling of MOSFETs. In any event, the W/L ratio is poorly defined for such enclosed device structures, adding additional complications and uncertainties in design. Further, enclosed geometry MOSFETs generally consume more semiconductor die area than non-enclosed MOSFETs.

In an embodiment, the absence of STI in the transfer transistor maintains a low leakage property even after exposure to radiation. A typical leakage path after exposure to radiation is along the sides of a MOSFET. For example, in regions where active poly silicon comes in contact with STI, such edges underneath a gate are a typical source of leakage. Another leakage path comprises floating diffusion under STI leaking to any other N+ region, e.g., source or drain region of neighboring MOSFETs.

The ring transfer transistor with the pinned photo diode around it and the floating diffusion on the inside may produce a radiation tolerant 4T pixel with low dark current.

In addition, location of the transfer transistor within, e.g., surrounded by, the photo diode may increase the speed of operation of transferring the charge collected by the photo diode to the floating diffusion. In this manner, the image sensing circuit may be able to operate faster. Further, a transfer transistor surrounded by a photo diode and surrounding a storage element, e.g., a floating diffusion, may increase the efficiency or completeness of charge transfer. For example, transfer transistors may transfer a greater percentage of charge collected by the photo diode to a floating diffusion. In this manner, embodiments in accordance with the present invention may enable higher speed operation, e.g., faster "exposure" times and/or increased frame rates, and low light performance, in addition to increased radiation hardness.

Figure 4:
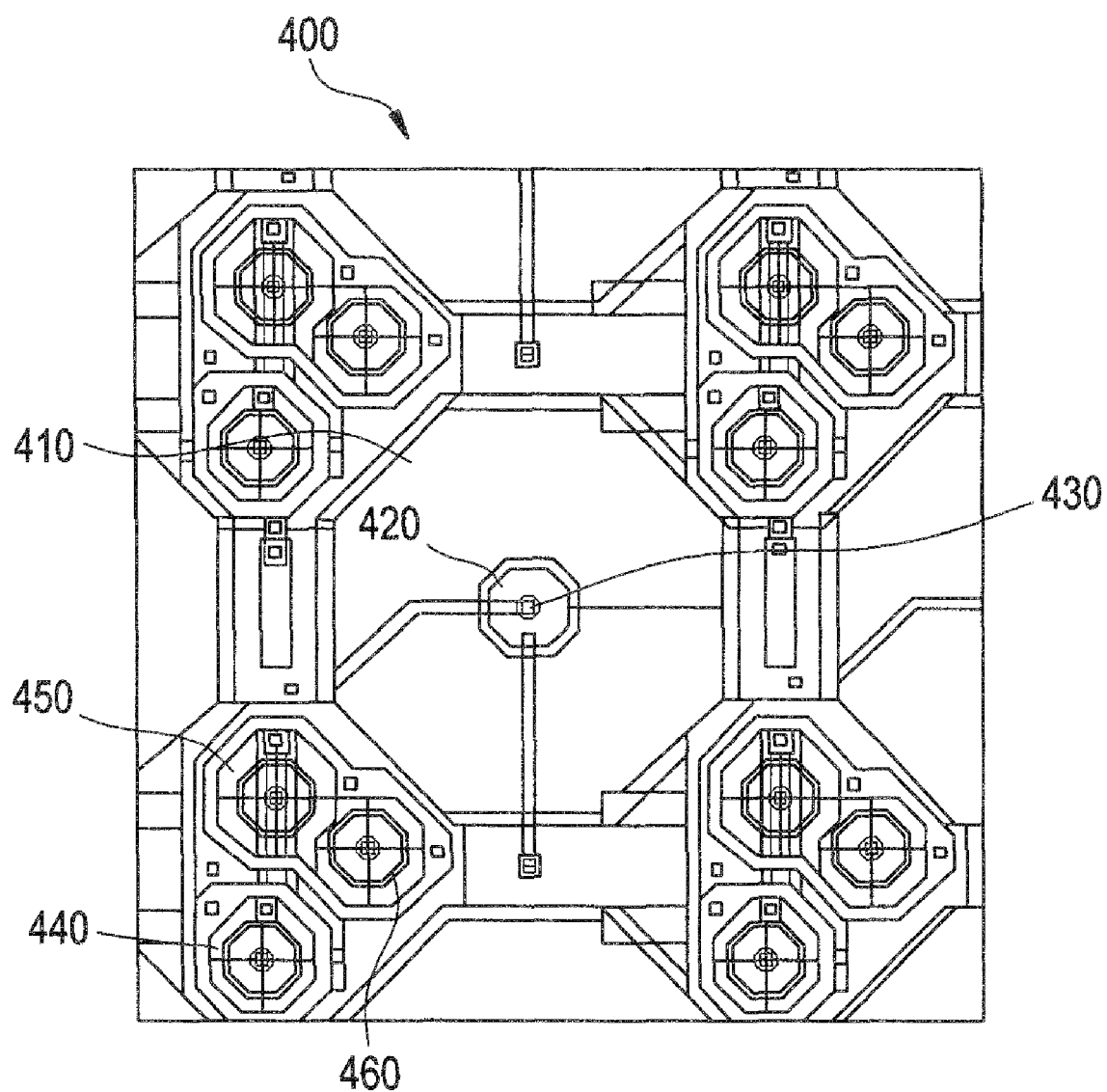
FIG. 4 illustrates a layout of a pixel image, in accordance with embodiments of the present invention.

FIG. 4 illustrates an exemplary layout 400 of a pixel image sensor, in accordance with embodiments of the present invention. FIG. 4 is not to scale, so as to better illustrate selected features of structure 400. Pixel image sensor 400 comprises a floating diffusion 430, surrounded by a ring transfer transistor 420, which are in turn surrounded by a photo diode 410. These features generally correspond to floating diffusion 130, ring transfer transistor 120 and photo diode 110, as described in FIG. 2.

Pixel image sensor 400 further comprises three additional transistors in order to form a "4T" pixel, as shown by the schematic 100 in FIG. 1. Pixel image sensor 400 further comprises a source follower amplifier transistor 450, a select transistor 440 and a reset transistor 460. These features generally correspond to source follower amplifier transistor 150, a select transistor 140 and reset transistor 160 as described in FIG. 1. Source follower amplifier transistor 450, select transistor 440 and reset transistor 460 are illustrated as "circular" transistors. In general, circular transistors decrease leakage current. Such circular, or "approximately circular" transistors further go well with the generally circular layout of photo diode 110. It is to be appreciated that embodiments in accordance with the present invention are well suited to other transistor shapes as well.

Figure 5:
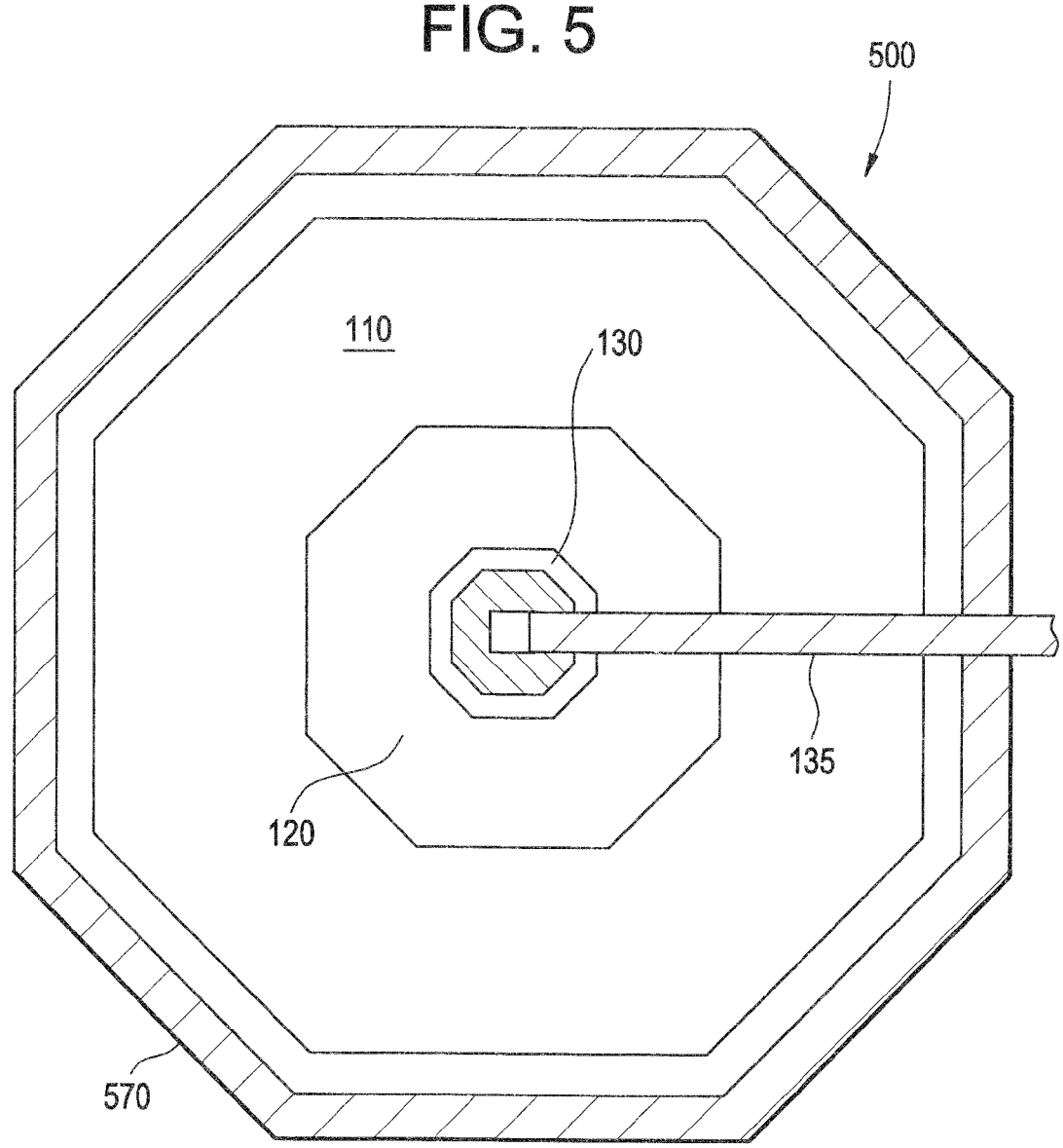
FIG. 5 illustrates a plan or layout view of a photodiode and a ring transfer gate, in accordance with embodiments of the present invention.

FIG. 5 illustrates a plan or layout view of a photodiode and a ring transfer transistor 500, in accordance with embodiments of the present invention. FIG. 5 is not to scale, so as to better illustrate selected features of structure 500. Structure 500 generally corresponds to photo diode 110, transfer transistor 120 and floating diffusion 130 as highlighted in the circled portion of schematic 100 of FIG. 1 and as illustrated in FIG. 2.

In addition to those structures previously identified in FIG. 2, structure 500 comprises an additional poly silicon ring 570 surrounding the outside of the photo diode 110. The poly silicon ring 570 separates the photo diode 110 from STI structures, and may further reduce leakage from the photo diode 110. The poly silicon ring 570 does not function as a transfer transistor or other transistor. Accordingly, the implants, e.g., species, energies and/or duration of implanting, can be optimized for low leakage instead of being optimized for transfer transistor characteristics.

Figure 6:
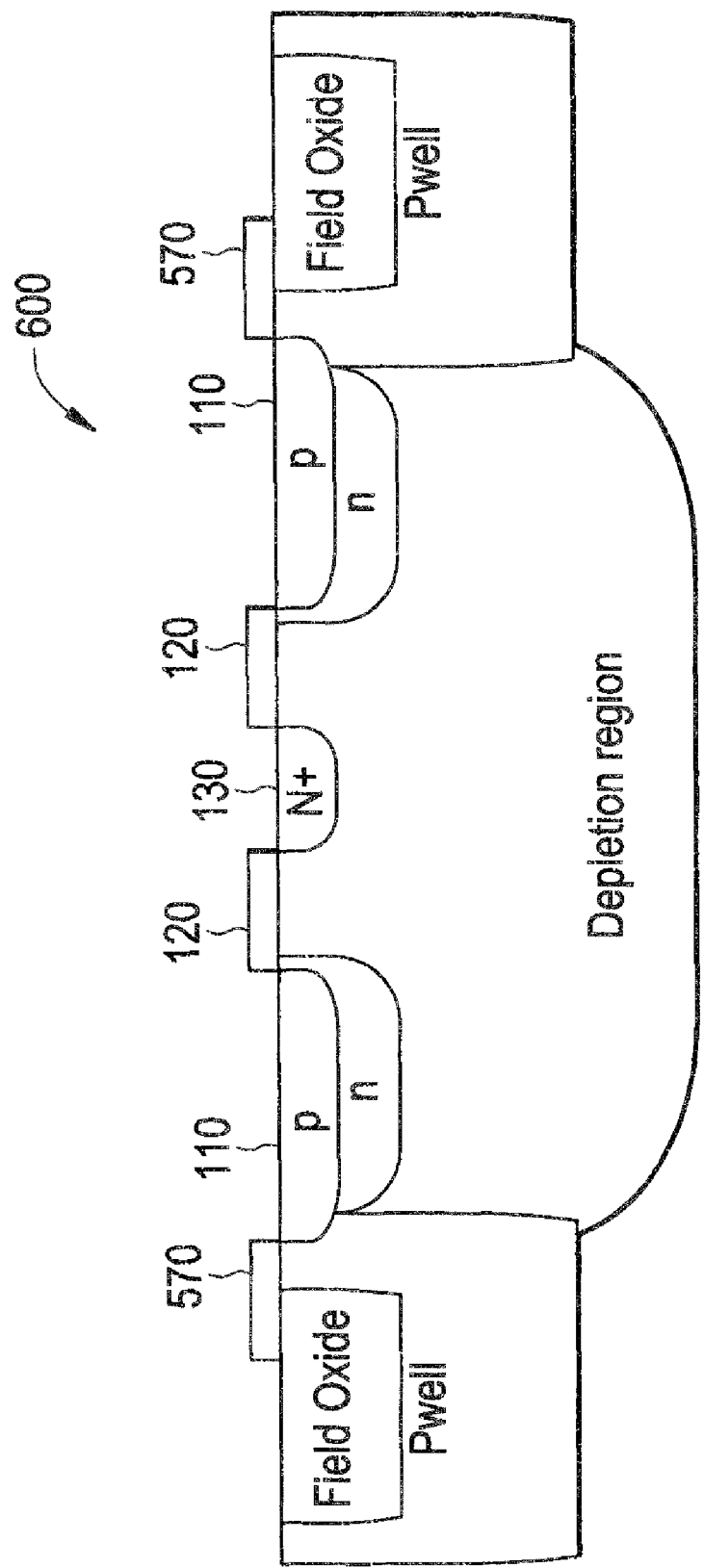
FIG. 6 illustrates a side sectional view of a photodiode and a ring transfer gate, in accordance with embodiments of the present invention.

FIG. 6 illustrates a side sectional view of a photodiode and a ring transfer transistor 600, in accordance with embodiments of the present invention. FIG. 6 is not to scale, so as to better illustrate selected features of structure 600. Structure 600 generally corresponds to structure 500 (FIG. 5), and comprises the poly silicon ring 570 surrounding the outside of the photo diode 110.

As previously described with respect to FIGS. 2 and 3, the photo diode 110, transfer transistor 120 and floating diffusion 130, as well as poly silicon region 570, need not be circular or approximately circular. Rather, embodiments in accordance with the present invention are well suited to a variety of closed shapes. In general, poly silicon region 570 should contact photo diode 110.

Embodiments in accordance with the present invention include low leakage pinned photodiodes using ring transfer transistors. In addition, systems and methods of image sensors with photo diodes surrounding transfer transistors are disclosed in embodiments herein. Embodiments described herein may be compatible and complementary with existing systems and methods of semiconductor image sensor manufacturing and operation.

Various embodiments of the invention are thus described. While the present invention has been described in particular embodiments, it should be appreciated that the invention should not be construed as limited by such embodiment.

What is claimed is:

1. A method for manufacturing a pixel sensing circuit, comprising:
   providing a semiconductor material of a first conductivity type;
   forming a gate structure configured as an enclosed geometric structure over a portion of the semiconductor material, the gate structure having an interior side and an exterior side;
   forming a first doped region of a second conductivity type adjacent the interior side of the gate structure;
   forming a second doped region of the second conductivity type adjacent the exterior side of the gate structure, wherein the gate structure and the first and second doped regions form a transfer transistor and wherein the first doped region serves as a charge storage element; and
   forming a third doped region of the first conductivity type adjacent the exterior side of the gate structure and laterally surrounding the gate structure, wherein the third doped region, the second doped region, and a portion of the semiconductor material form a photo diode region, and wherein a reset transistor is formed outside the photo diode region.

2. The method of claim 1, wherein the first conductivity type is p-type conductivity and the second conductivity type is n-type conductivity.

3. The method of claim 1, further including forming a poly silicon structure surrounding the third doped region.

4. The method of claim 1, further including forming a fourth doped region of the first conductivity type in the semiconductor material.

5. The method of claim 4, wherein forming the third doped region includes forming a first portion of the third doped region in a portion of the fourth doped region and forming a second portion of the third doped region in a portion of the second doped region.

6. The method of claim 1, wherein forming the gate structure includes forming the gate structure to have a ring configuration.

7. The method of claim 1, further including configuring the gate structure and the first and second doped regions as a MOSFET transistor having an enclosed geometry.

8. The method of claim 1, further including coupling an amplifier to the charge storage element.

9. The method of claim 8, wherein the amplifier is a transistor configured as a source follower.

10. The method of claim 1, further including coupling the reset transistor to the charge storage element.

11. The method of claim 1, further including coupling an amplifier to the reset transistor, wherein the amplifier is outside the photodiode region.

* * * * *